United States Patent
Chakrabarti et al.

Patent Number: 6,048,747
Date of Patent: Apr. 11, 2000

[54] LASER BAR CLEAVING APPARATUS

[75] Inventors: Utpal Kumar Chakrabarti, Allentown, Pa.; David Reese Peale, Chatham, N.J.

[73] Assignee: Lucent Technologies, Inc., Murray Hill, N.J.

[21] Appl. No.: 09/071,629

[22] Filed: May 1, 1998

[51] Int. Cl.<sup>7</sup> ............................................. H01L 21/302
[52] U.S. Cl. ....................... 438/33; 438/68; 438/69; 438/113; 438/460; 438/462; 438/464
[58] Field of Search ........................... 438/462, 464, 438/33, 68, 69, 113, 114, 460, 461, 463, 386, 387; 225/1, 2, 3, 4

[56] References Cited

U.S. PATENT DOCUMENTS

| | | | |
|---|---|---|---|
| 4,044,937 | 8/1977 | Hill et al. ................................. | 225/97 |
| 4,653,680 | 3/1987 | Regan ...................................... | 225/104 |
| 4,995,539 | 2/1991 | Richard . | |
| 5,154,333 | 10/1992 | Bauer et al. . | |
| 5,171,717 | 12/1992 | Broomer et al. . | |
| 5,238,876 | 8/1993 | Takeuchi et al. ........................ | 438/113 |
| 5,259,925 | 11/1993 | Herrick et al. . | |
| 5,272,114 | 12/1993 | van Berkum et al. . | |
| 5,393,707 | 2/1995 | Canning . | |
| 5,418,190 | 5/1995 | Cholewa et al. ......................... | 438/460 |
| 5,785,225 | 7/1998 | Loomis et al. .......................... | 225/96.5 |
| 5,985,742 | 11/1999 | Henley et al. ........................... | 438/113 |

*Primary Examiner*—Mary Wilczewski
*Assistant Examiner*—Yung A. Lin

[57] ABSTRACT

A cleaving apparatus for separating a wafer (or bar) bar of optical devices into separate bars (or individual optical devices) comprises a relatively thin wire, preferably tungsten. The wire is forced against the underside of the bar directly underneath the location of a top side scribe mark. The wire, having a highly uniform, well-controlled radius of curvature, induces a known, reproducible stress through the body of the bar and nucleates a cleavage crack under the scribe mark. A force applied to the top surface of the bar will allow the cleaving crack to propagate cleanly along a single crystal surface through the depth of the bar to the location of the wire.

8 Claims, 2 Drawing Sheets

10

10

6,048,747

LASER BAR CLEAVING APPARATUS

SUMMARY OF THE INVENTION

The present invention relates to a laser bar cleaving apparatus for use in the fabrication of semiconductor optical devices and, more particularly, to the use of a relatively thin wire, disposed under a scribe mark on the material to be cleaved. The wire provides a well-controlled and highly uniform radius of curvature for effectuating a clean cleave through the material.

In the manufacture of devices such as semiconductor lasers and amplifiers or superluminant diodes, the initial fabrication steps are performed on a semiconductor wafer containing hundreds of separate devices. After an initial set of processing steps (referred to as "wafer level" processing), the wafer is cleaved into a number of separate rows of devices, where these rows are referred to in the art as "bars". After additionally processing of the devices in bar form, it is necessary to "break" the bar to form the individual devices. In conventional optical device processing, the formation of bars and devices is typically performed by a cleaving process. The cleaving process requires the wafers or bars be placed on a thin supporting membrane and "tick marks" are then placed at the desired locations where the cleaves are to be initiated. A tensile strain is then applied to the material to be cleaved in order to initiate crack formation and propagation from the tick mark through the bulk of the material. The tensile strain is induced by the formation of a bending moment created by forces applied to the top and bottom of the material to be cleaved. Typically, the force applied to the side opposite the tick mark is applied via the edge of a "support mandrel" or, alternatively, by a knife edge. In the case of the support mandrel, the force applied to the side carrying the tick mark is generated by a pair of rolling wheels which straddle the edge of the support mandrel and press on the material to be cleaved. In the case of knife edge breaking, the force applied to the side carrying the tick mark is generated by a flat anvil pad which is slightly compliant so that a bending strain can be generated in the material to be cleaved when the pad presses the material against the knife edge. In both cases, the support mandrel and knife edge are specially prepared items which must be fabricated with great precision and care in order to function properly. Specifically, the edges of these items must be free of lateral deviations along their lengths, as well as free from variations in the height or sharpness of the edge. If these items become worn, nicked or otherwise damaged during use, the tool must be removed, repaired and replaced (including a tedious realignment process). Obviously, the need to replace damaged cleaving tools is problematic in that it is both time consuming and expensive.

Thus, a need remains in the prior art for a cleaving arrangement that simplifies the nature and economy of the apparatus which creates the bending moment in the material to be cleaved.

SUMMARY OF THE INVENTION

The need remaining in the art is addressed by the present invention, which relates to a cleaving apparatus and, more particularly, to the use of a relatively thin wire, disposed under a scribe mark to provide a well-controlled and highly uniform radius of curvature for effectuating a clean cleave.

In accordance with the teachings of the present invention, a wire having a radius in the range of, for example, 0.001" to 0.010", is used in place of a convention knife edge or support mandrel. In particular, the wire is positioned against the underside of the material (wafer or bar), directly under the scribe formed on the epitaxial side of the material. The wire exhibits a finite and uniform radius of curvature that is beneficial to the breaking process in that it allows the applied stress to be concentrated at the scribe mark without requiring the wire to be precisely positioned below the mark. Further, the finite radius of curvature prevents the formation of excess stress on the bottom of the material to be cleaved (where this stress can interfere with the straight propagation of the desired cleave). Additionally, if the wire is nicked or damaged during use, it can easily be replaced. In one embodiment, a tungsten wire is used, and is preferred, due to its favorable hardness.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
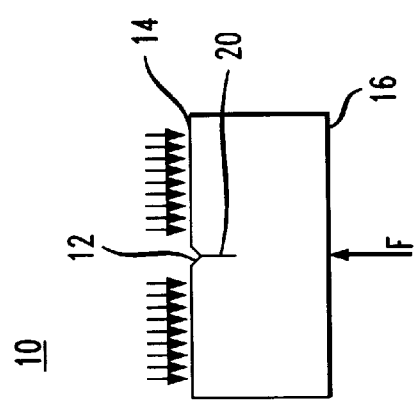
FIG. 1 is a side view of a wafer bar indicating the location of a scribe mark on the epitaxial surface and illustrating the generalized loading forces that create the bending moment that initiates crack formation and propagation from the scribe mark.

In the process of breaking a wafer into bars, or a bar into a set of individual semiconductor optical devices, all conventional processes rely on applying a bending moment to the material to be cleaved so that an existing scribe mark in the top surface (epitaxial side) nucleates a cleaving crack that propagates down through the thickness of the material and results in bar or device separation. FIG. 1 illustrates a side view of an exemplary optical device bar 10, where a relatively small scribe mark, or tick, 12 has been formed in the top surface 14. In most cases, top surface 14 will be the epitaxial side of bar 10. The application of a force F to bottom surface 16 (usually the substrate side) underneath the location of scribe mark 12, in conjunction with the counterforces f applied to top surface 14, creates a bending moment through the depth of bar 10 and nucleates a cleavage crack 20 at the bottom of scribe mark 12. Cleavage crack 20 subsequently propagates downward through bar 10 to form the final cleaved structure.

Figure 3:
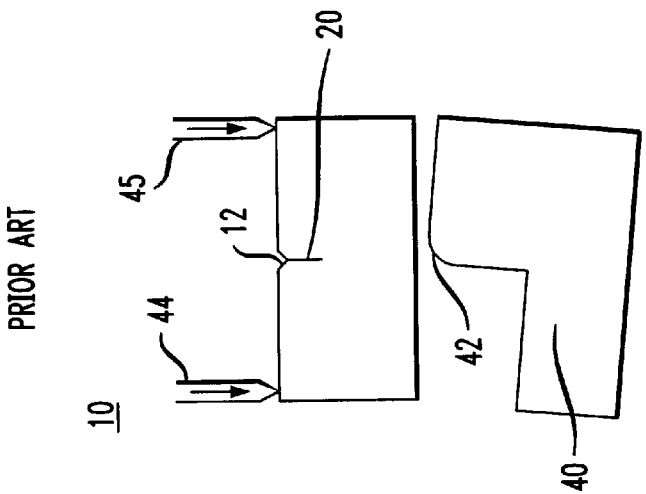
FIG. 3 illustrates a prior art support mandrel and pressure wheels used to cleave wafers or bars.
Figure 2:
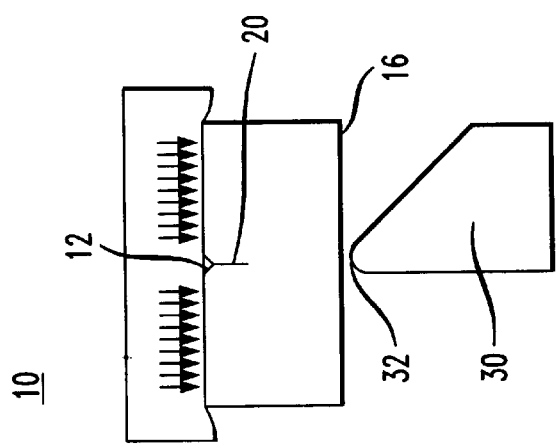
FIG. 2 illustrates a prior knife edge and anvil apparatus used to cleave wafers or bars.
Figure 4:
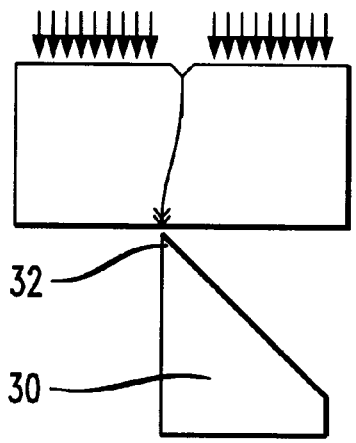
FIG. 4 illustrates problems associated with an over-sharpened knife edge cleaving tool.

A conventional apparatus used to apply the substrate-side force to a laser bar is a knife edge device 30, as shown in FIG. 2. In this process, a sharpened end 32 of knife edge 30 is aligned with scribe mark 12 and forced upwards against bottom surface 16 to induce stress within bar 10 and nucleate cleavage crack 20. Referring to FIG. 3, a second conventional method employs a support mandrel 40 with a breaking edge 42 and pressure wheels 44,45 to create the bending moment in bar 10. As before, the bending moment nucleates a cleavage crack 20 at the bottom of scribe mark 12 which thereafter propagates down through bar 10. If knife edge 32 is too sharp, then non-ideal cleaves may result. Additionally, excessive stress concentration from the sharp knife edge 32 may perturb the stresses induced by the bending moment. In particular, as shown in FIG. 4, if knife edge device 30 is slightly mis-aligned with scribe mark 12, then the stresses from sharp knife edge 32 can cause the cleave to deviate from the original plane of cleaving, resulting in uneven and rough facets—an unacceptable result.

Figure 5:
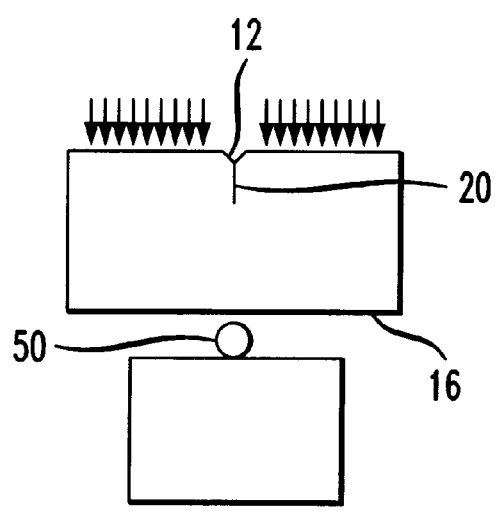
FIG. 5 illustrates a cleaving wire apparatus of the present invention.

FIG. 5 illustrates a cleaving apparatus formed in accordance with the present invention that overcomes these and other problems associated with prior art arrangements. In particular, the cleaving apparatus comprises a thin wire 50 that is used in place of the support mandrel or knife edge arrangements of the prior art. In particular, a relatively thin wire (for example, having a diameter on the order of 0.002"–0.020") is positioned against the underside 16 of laser bar 10 underneath scribe mark 12. In contrast to prior art devices, the radius of curvature of the breaking edge, by virtue of being a wire, is easily made to be highly uniform and well-controlled along the entire length of the wire. The uniformity of this radius ensures that the stress applied to bar (or wafer) 10 builds up evenly along its entire length so that when the cleavage crack nucleates, it propagates smoothly along the length of the bar (or wafer). Furthermore, the finite radius of wire 50 prevents excessive stress from perturbing the propagation of the cleavage crack out of the desired plane of cleavage in the event that the wire is not located precisely below the scribe mark. Additionally, the wire is preferably formed of tungsten, a relatively strong and hard material that will resist wear during use. However, should the cleaving wire become damaged, nicked, or broken, it can be easily replaced. In contrast, as discussed above, the repair or replacement of a knife edge cleaving tool of the prior art was often found to be a time-consuming and costly problem.

It is to be understood that the radius of wire used in the cleaving apparatus of the present invention will be chosen as a function of the material of the cleaved, as well as the thickness of the material. For the exemplary use with a GaAs laser bar having a thickness of approximately 0.004", a tungsten wire having a diameter in the range of 0.002" to 0.020" has been found useful. It is anticipated that variations on this diameter may be appropriate and, in general, a wire diameter less than or equal to the thickness of the material to be cleaved may be used, and may have certain benefits under other conditions. Other and further modifications will be apparent to the user and are considered to fall within the spirit and scope of the present invention.

What is claimed is:

1. A method of cleaving a bar of optical devices into individual devices, the method comprising the steps of:
    a) providing a bar of optical devices, the bar defined as comprising a top surface and bottom surface;
    b) forming a scribe mark along said top surface at a location associated with a desired endface location for an individual optical device;
    c) placing a wire having a diameter less than or equal to the thickness of said bar against the bottom surface of said bar so as to be disposed underneath the location of the scribe mark formed in step b)
    d) exerting a force against said wire sufficient to induce stress throughout the bar and nucleate a cleavage crack under said scribe mark; and
    e) continuing to apply a force to allow the cleavage crack to propagate through said bar to the bottom surface, thereby separating an optical device from said bar.

2. The method according to claim 1 wherein in performing step c), a tungsten wire is used.

3. The method according to claim 1 wherein in performing step c), a wire having a diameter in the range of 0.002" to 0.020" is used.

4. The method according to claim 1 wherein in performing step c), a tungsten wire having a diameter in the range of 0.002" to 0.020" is used.

5. A method of cleaving a semiconductor wafer of optical devices into individual bars of devices, the method comprising the steps of:
    a) providing a wafer of optical devices, the wafer defined as comprising a top surface and bottom surface;
    b) forming a scribe mark along said top surface at a location associated with a desired endface location for an individual bar of devices;
    c) placing a wire having a diameter less than or equal to the thickness of said wafer against the bottom surface of said wafer so as to be disposed underneath the location of the scribe mark formed in step b);
    d) exerting a force against said wire sufficient to induce stress throughout the wafer and nucleate a cleavage crack under said scribe mark; and
    e) continuing to apply a force to allow the cleavage crack to propagate through said wafer to the bottom surface, thereby separating said wafer into separate bars of optical devices.

6. The method according to claim 5 wherein in performing step c), a tungsten wire is used.

7. The method according to claim 5 wherein in performing step c), a wire having a diameter in the range of 0.002" to 0.020" is used.

8. The method according to claim 5 wherein in performing step c), a tungsten wire having a diameter in the range of 0.002" to 0.020" is used.

* * * * *